(12) United States Patent
Lim et al.

(10) Patent No.: US 6,723,642 B1
(45) Date of Patent: Apr. 20, 2004

(54) METHOD FOR FORMING NITROGEN-CONTAINING OXIDE THIN FILM USING PLASMA ENHANCED ATOMIC LAYER DEPOSITION

(75) Inventors: Jung-wook Lim, Daejeon (KR); Sun-jin Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/377,471

(22) Filed: Feb. 27, 2003

(30) Foreign Application Priority Data

Oct. 22, 2002 (KR) ................. 10-2002-0064524

(51) Int. Cl.[7] ............... H01L 21/44; H01L 21/31; H01L 21/469
(52) U.S. Cl. ............... 438/680; 438/681; 438/685; 438/688; 438/785
(58) Field of Search ................. 438/680, 681, 438/685, 688, 785; 427/569, 255.28

(56) References Cited

U.S. PATENT DOCUMENTS

2003/0072975 A1 * 4/2003 Shero et al. ............... 428/704

* cited by examiner

*Primary Examiner*—Alexander Ghyka
(74) *Attorney, Agent, or Firm*—Blakely, Sokoloff, Taylor & Zafman

(57) ABSTRACT

A method for forming a nitrogen-containing oxide thin film by using plasma enhanced atomic layer deposition is provided. In the method, the nitrogen-containing oxide thin film is deposited by supplying a metal source compound and oxygen gas into a reactor in a cyclic fashion with sequential alternating pulses of the metal source compound and the oxygen gas, wherein the oxygen gas is activated into plasma in synchronization of the pulsing thereof, and a nitrogen source gas is further sequentially pulsed into the reactor and activated into plasma over the substrate in synchronization with the pulsing thereof. According to the method, a dense nitrogen-containing oxide thin film can be deposited at a high rate, and a trace of nitrogen atoms can be incorporated in situ into the nitrogen-containing oxide thin film, thereby increasing the breakdown voltage of the film.

20 Claims, 5 Drawing Sheets

METHOD FOR FORMING NITROGEN-CONTAINING OXIDE THIN FILM USING PLASMA ENHANCED ATOMIC LAYER DEPOSITION

BACKGROUND OF THE INVENTION

This application claims priority from Korean Patent Application No. 2002-64524, filed on Oct. 22, 2002, in the Korean Intellectual Property Office, the disclosure of which is incorporated herein in its entirety by reference.

1. Field of the Invention

The present invention relates to a method for forming an insulating thin film in the manufacture of a variety of electronic devices, and more particularly, to a method for forming a metal oxide thin film using atomic layer deposition (ALD).

2. Description of the Related Art

Generally, insulating films for electronic devices have been formed using physical vapor deposition (PVD) or chemical vapor deposition (CVD). Recently, the application of atomic layer deposition (ALD) in forming such insulating films is gradually increasing. As is well known, rather than simultaneously supplying source gases into a reactor, ALD involves sequentially alternating pulses of different kinds of source gases to form a thin film. In particular, the source gases are supplied sequentially into a reactor at predetermined time intervals as pulses by timely opening and closing gas supply valves for the source gases positioned near the entrance of the reactor. In general, a purge gas is supplied following each pulsing source gases at a predetermined rate to remove the remaining, un-reacted gas from the reactor. More recently, plasma enhanced ALD has been suggested for film formation.

Various kinds of insulating films used in the semiconductor field and which can be formed by ALD include, for example, gate dielectrics having a very small thickness requirement, capacitor dielectric layers, and insulating oxide layers. The use of $Al_2O_3$, $ZrO_2$, or $HfO_2$ for gate dielectrics and $Al_2O_3$, $Ta_2O_5$, or $(Ba, Sr)TiO_3$ for capacitor dielectric layers have been investigated more actively in conjunction with the application of ALD. As a result, it was found that an $Al_2O_3$ film having a very uniform thickness can be formed through accurate film thickness control using ALD (Journal of the Electrochemical Society, 149(6), pp. C306 (2002)).

ALD has been applied in the display device field as well as in the semiconductor field. Research has been conducted on ALD for a large-sized, thin film display having good step coverage and easy thickness control requirements. For example, for an electroluminescence display (ELD) formed by sequentially depositing a phosphor layer and an insulating layer, ALD involving in situ sequential deposition of these layers within the same reactor is preferred. An $Al_2O_3$ or an aluminum titanium oxide (ATO) layer is mostly used for the insulating layer. An $Al_2O_3$ layer formed using ALD is known to be denser and more uniform in thickness as compared with that formed using PVD or CVD.

Although the insulating layer deposited by ALD has a higher density and more uniform thickness, its electrical insulating properties should be strong enough to resist a high field strength for use in ELDs. However, if the thickness of the insulating layer is increased to prevent a breakdown, the threshold voltage for electroluminescenece may increase. Therefore, what is needed in the ELD field is a method for forming an insulating layer having a large dielectric constant and a high breakdown voltage even with a small thickness.

SUMMARY OF THE INVENTION

The present invention provides a method for forming an insulating layer, and more particularly, a metal oxide layer having a large dielectric constant and a high breakdown voltage even with a small thickness.

According to an aspect of the present invention, there is provided a method for incorporating nitrogen atoms into a metal oxide thin film in situ using plasma based on conventional atomic layer deposition (ALD). In particular, the metal oxide thin film is formed on a substrate by supplying a metal source compound and oxygen gas into a reactor in a cyclic fashion with sequential alternating pulses of the metal source compound and the oxygen gas, wherein the oxygen gas is activated into plasma in synchronization of the pulsing thereof, and a nitrogen source gas is further sequentially pulsed into the reactor and activated into plasma over the substrate in synchronization with the pulsing thereof. In other words, the invention is directed to the formation of a metal oxide thin film containing a trace of nitrogen by plasma enhanced atomic layer deposition (PEALD).

Since the thin film formation method according to the present invention is based on ALD, the advantages of ALD, such as the ability to grow a dense, uniform thin film, are ensured. In addition, the use of plasma in the present invention further increases the density of the thin film and the growth rate. Furthermore, since a trace of nitrogen atoms can be incorporated in situ into the thin film being grown, the resulting thin film is provided with improved breakdown characteristics. The added nitrogen atoms improve the passivation properties for the incorporation of moist or impurities as well as the electrical properties.

In an embodiment of the present invention, a nitrogen-containing $Al_2O_3$ thin film may be formed. The nitrogen-containing $Al_2O_3$ thin film according to the present invention has a high dielectric constant and can be used as a dielectric film for gate dielectric or memory dielectric layers of next generation semiconductor devices. In addition, the nitrogen-containing $Al_2O_3$ thin film can be applied to a various kinds of electronic devices as passivation purposes in order to prevent the incorporation of moist or impurities. In addition, the nitrogen-containing $Al_2O_3$ thin film is very suitable to be used as an insulating layer that is deposited on or underneath the phosphor layer of an electroluminescence device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
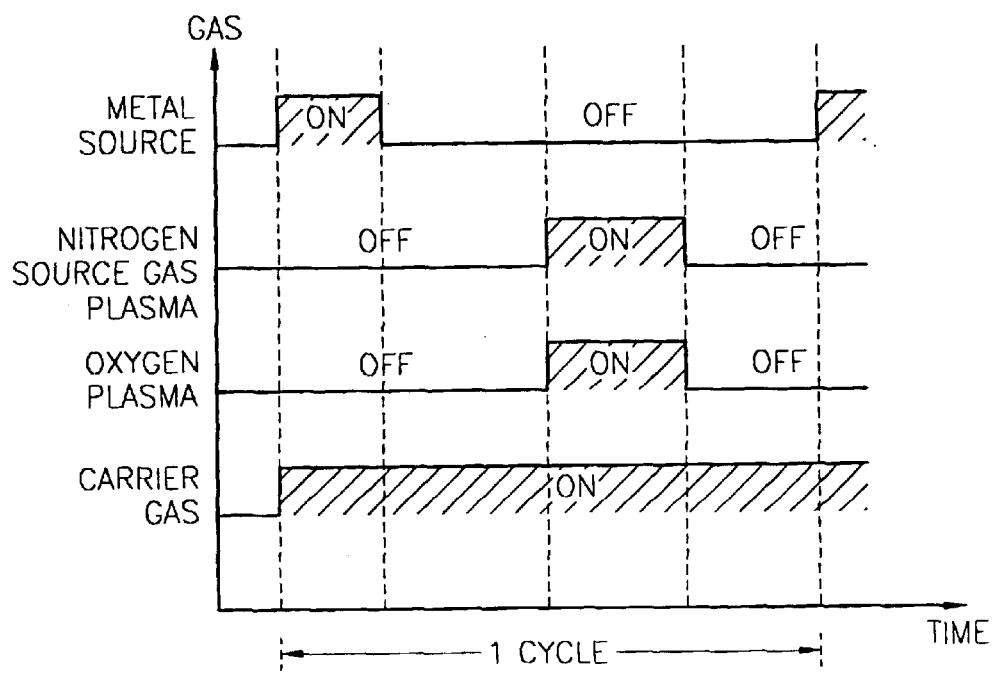
FIGS. 1 through 4 are gas pulsing diagrams applied in forming a nitrogen-containing metal oxide film using plasma enhanced atomic layer deposition (PEALD) according to the present invention.

Embodiments of the present invention will be described in detail with reference to the accompanying drawings. This invention may, however, be embodied in many different forms and should not be construed as being limited to the embodiments set fourth herein; rather, these embodiments are provided so that this disclosure will be thorough and complete, and will fully convey the concept of the invention to those skilled in the art.

In a thin film formation method according to the present invention, in order to form a metal oxide film on a substrate loaded into a reactor, a metal source compound and oxygen gas as a reactant gas are supplied into the reactor in a cyclic fashion with sequential alternating pulses of the metal source compound and oxygen gas, wherein the oxygen gas is activated into plasma over the substrate in synchronization with the pulsing thereof. The oxygen gas is decomposed into oxygen radicals or ions to activate reaction. Besides the metal source compound and oxygen gas, nitrogen source gas is further supplied, wherein the nitrogen source gas is activated into plasma over the substrate in synchronization with the pulsing thereof. A metal oxide thin film having optimal properties can be formed by appropriately controlling the flow rates of the nitrogen source gas and the oxygen gas. The nitrogen source gas may be nitrogen gas ($N_2$), ammonia gas ($NH_3$), nitrogen dioxide gas ($NO_2$), nitrogen hypooxide gase ($N_2O$), or a mixture of the foregoing gases. When using nitrogen gas, less nitrogen atoms are incorporated into the metal oxide layer for the same level of RF source power as when using ammonia gas. This is considered to be related with the fact that ammonia is more likely to decompose than nitrogen gas for an equal level of source power. The pulsing cycle can be varied according to the way nitrogen source gas is added into the metal oxide layer.

FIGS. 1 through 4 are gas pulsing diagrams applied in forming a nitrogen-containing metal oxide film using plasma enhanced atomic layer deposition (PEALD) according to the present invention. A variety of pulsing cycles illustrated in FIGS. 1 through 4 include both cases of supplying source gases into the reactor after and without dilution with inert carrier gas. Suitable examples of carrier gases include helium gas as well as argon gas. The carrier gas serves as a purging gas to remove the remaining unreacted gas from the reactor while the supply of the source gases is suspended, as well as serves as a carrier for the metal source compound. The metal oxide may be $Al_2O_3$, $Ta_2O_5$, $TiO_2$, $ZrO_2$, $HfO_2$, or lanthanide series oxide. Suitable metal source compounds include chlorides and organic materials. For example, as metal source compounds, $[(Ta(OC_2H_5)_4)(OCH_2CH_2N(CH_3)_2)]$ known as TAE(dmae) may be used for a nitrogen-containing $Ta_2O_5$ thin film, trimethylaluminum (TMA) may be used for a nitrogen-containing $Al_2O_3$ thin film, tetrakis (dimethylamido)titanium known as TDMAT or titanium of tetra-isopropoxide may be used for a nitrogen-containing $TiO_2$ thin film.

In the case illustrated in FIG. 1, after a metal source compound is supplied into the reactor, a nitrogen source gas is supplied in synchronization with the supply of oxygen gas as reactant gases. In particular, under the conditions of a wafer temperature of 250–400° C. and a reactor pressure of about 3 torr, a metal precursor (metal source compound) in vapor phase is supplied into the reactor by opening a metal source supply valve, which is indicated as "ON" state in FIG. 1, while being diluted with a carrier gas supplied at a flow rate of 200 sccm through the top and/or sidewall of the reactor. After supplying the metal source compound for about 1–2 seconds, only the metal source supply valve is closed, which is indicated as "OFF" state in FIG. 1, while the carrier gas is continuously supplied to purge a physisorbed metal source compound on the wafer or the unrreacted, remaining metal source compound from the reactor.

After 2–3 seconds later, while the carrier gas is supplied into the reactor, oxygen gas at a rate of 30–100 sccm and nitrogen source gas at an appropriate rate are simultaneously supplied to generate plasma of these gases in a, synchronous manner. An RF source power, for example, of 200–400 W for a 12-inch wafer is applied. The flow rate of the nitrogen source gas is adjusted according to the kind of nitrogen source gas used, for example, to about 5–15 sccm when nitrogen gas is selected. As described above, these gases may be supplied while being diluted with the carrier gas or may be supplied separately from the carrier gas. However, in either case, the total flow rate of the carrier gas supplied into the reactor is controlled to a large quantity, for example 500–600 sccm, but needs to be varied appropriately for different reactors. After sustaining plasma generation for about 1–2 seconds, an oxygen gas supply valve and a nitrogen source gas supply valve are closed, and a source power switch is turned off, so that only the carrier gas is supplied to purge physisorbed or unreacted remaining gases from the reactor. After sustaining the purging duration for about 1–2 seconds, the metal source compound supply valve is opened, thereby terminating one cycle. The duration of purging between each supply of source and reactant gases is adjusted according to the kind of metal source compound used. One cycle period is about 6–7 seconds. This cycle is repeated until a metal oxide thin film having a desired thickness is obtained.

As the reactant gases are activated into plasma, reactions with the metal source compound adsorbed on the wafer is facilitated, and activation energy is supplied to the resulting thin film, thereby greatly improving the crystalline and physical properties of the film. The resulting metal oxide thin film further contains nitrogen atoms due to the supply of the nitrogen source gas. The nitrogen atoms in the metal oxide thin film increase the breakdown voltage of the metal oxide thin film.

Figure 2:
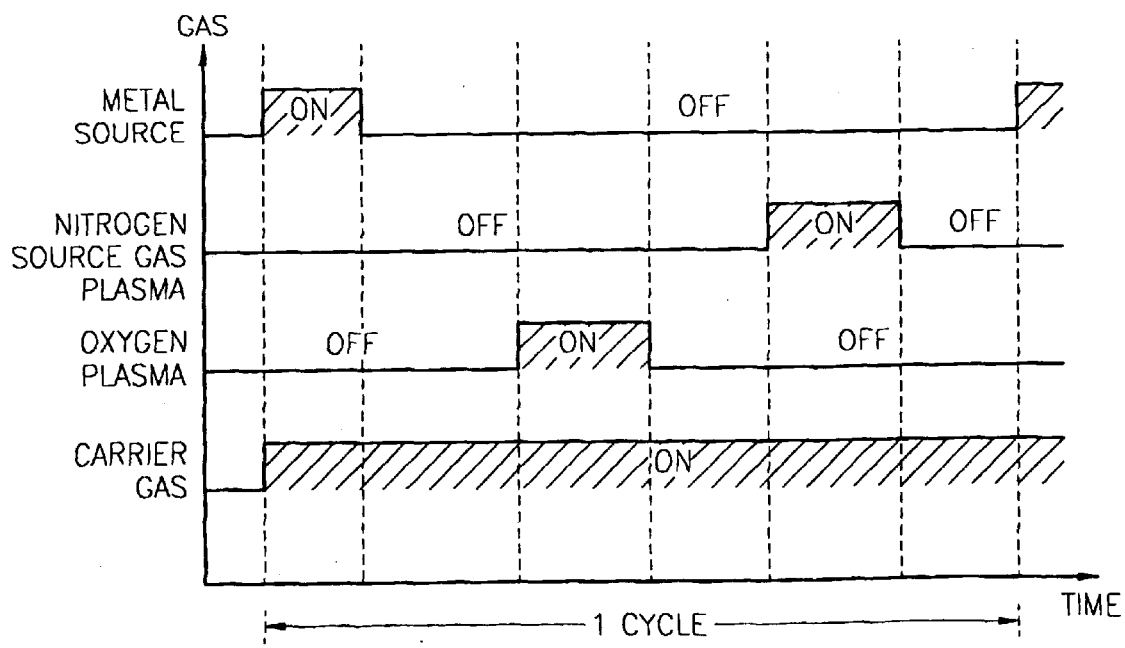
Figure 3:
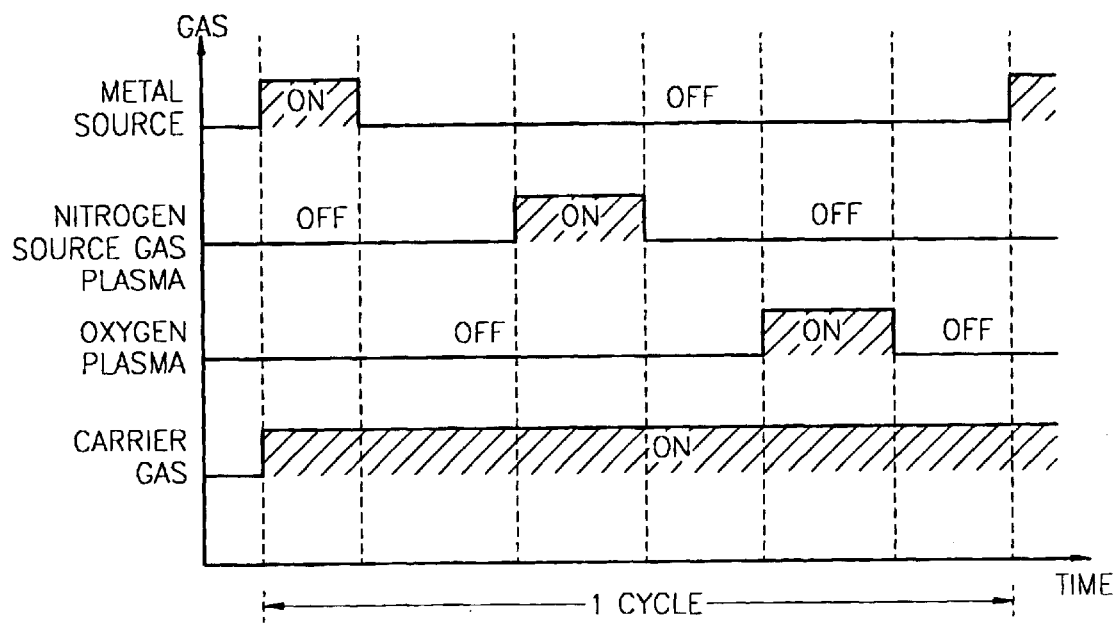

Alternatively, the oxygen gas and the nitrogen source gas may be supplied separately to generate plasma in an asynchronous manner, as illustrated in FIGS. 2 and 3. In the case of FIG. 2, after the generation of oxygen plasma and purging, nitrogen source gas plasma is generated. In the case of FIG. 3, as opposite to the case of FIG. 2, after the generation of nitrogen source gas plasma, oxygen plasma is generated.

The amount of nitrogen atoms incorporated into the metal oxide thin film and its electrical properties differ according to the kind of nitrogen source gas used, even with the application of an equal intensity of RF source power. However, it was found that the breakdown characteristics of the nitrogen-containing metal oxide thin film are always better than non-nitrogen containing metal oxide thin films. It is effective to use nitrogen gas, which is known to be less likely to decompose than ammonia gas, in order to incorporate a trace of nitrogen atoms into metal oxide thin films. However, when more nitrogen atoms need to be incorporated into a metal oxide thin film, plasma can be generated from ammonia gas or nitrogen dioxide gas, instead of nitrogen gas.

Figure 4:
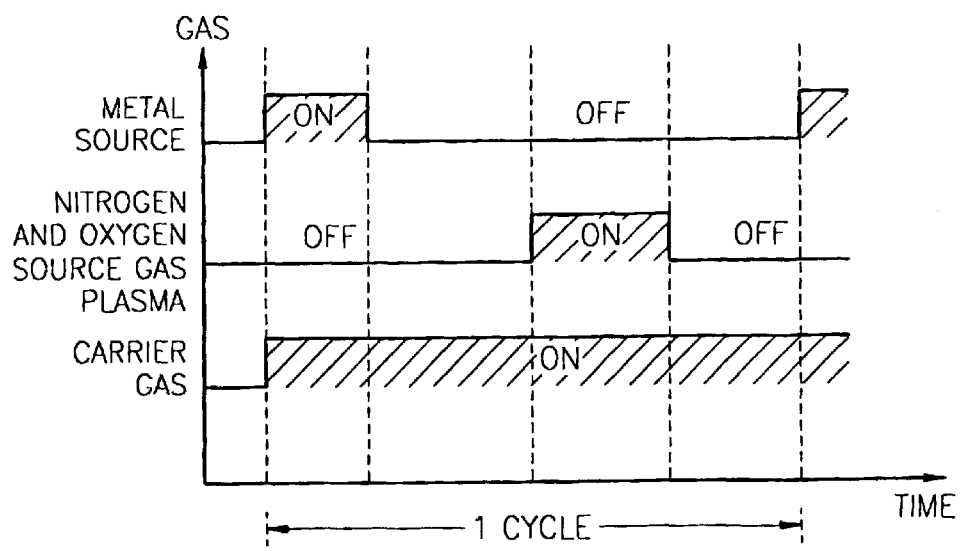

When nitrogen dioxide or nitrogen hypooxide gas is used for the nitrogen source gas, supplying oxygen gas to generate plasma may be omitted because these gases inherently contain both nitrogen and oxygen atoms, as illustrated in FIG. 4. However, as described above with reference to FIGS. 1 through 3, the oxygen gas may be supplied further together with or separately from nitrogen dioxide or nitrogen hypooxide gas.

A nitrogen-containing oxide thin film according to the present invention can be formed with uniformity in thickness and high density, which are advantages of conventional ALD, and at high growth rate. The high density of the insulating layer increases the breakdown voltage, so that all pixels of an ELD can be protected from a breakdown even at a high voltage level, thereby improving the stability of the ELD and reducing the leakage current. When the nitrogen-containing oxide thin film according to the present invention, instead of an $Al_2O_3$ or ATO layer, is used as an insulating film for an ELD device, the stability to a high voltage is ensured, and all the pixels are highly likely to be protected without defect. Accordingly, the thickness of the insulating layer can be reduced, providing an effect of reducing the threshold voltage.

In general, when using a high-dielectric thin film, the breakdown voltage becomes low, and the leakage current becomes high. However, these problems do not occur when using the nitrogen-containing metal oxide thin film according to the present invention, despite its high dielectric constant. These problems occurring in high-dielectric oxide films, such as a gate dielectric film or a capacitor oxide film of a memory device, can be eliminated when the nitrogen-containing metal oxide thin film formed using the PEALD method according to the present invention is applied to such high-dielectric oxide films.

When a thin film is formed using plasma, the resulting thin film becomes dense, and the breakdown voltage becomes high. However, in ELDs, the density of interface electron traps between the phosphor and insulating layers needs to be carefully managed and without causing plasma damage to the interface. Therefore, it is preferable that a nitrogen-containing metal oxide thin film formed using the method according to the present invention, having a multi-layered structure, as shown in FIGS. 5 and 6, be applied as an insulating layer to be formed on the phosphor layer for an ELD.

Figure 5:
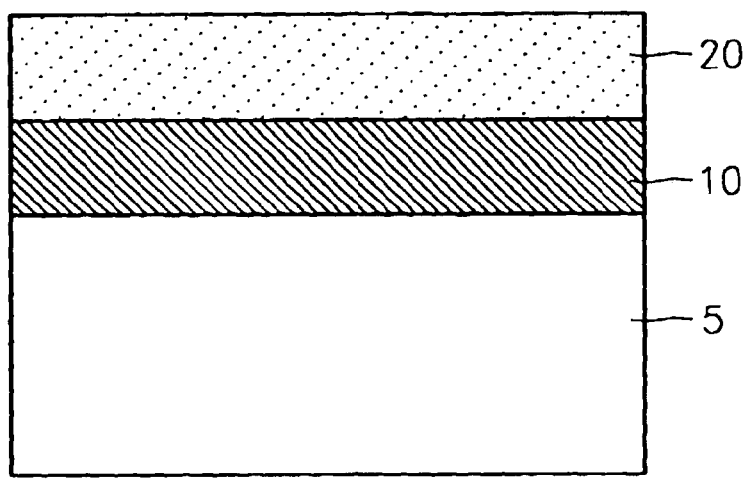
FIG. 5 is a sectional view showing an example of a nitrogen-containing metal oxide thin film formed using the PEALD method according to the present invention as an insulating layer.
Figure 6:
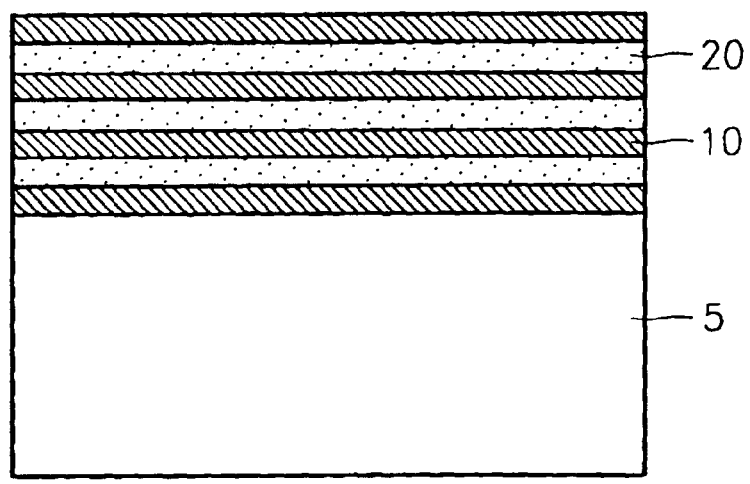
FIG. 6 is a sectional view showing another example of a nitrogen-containing metal oxide thin film formed using the PEALD method according to the present invention as an insulating layer.

Referring to FIG. 5, after a phosphor layer 5 is formed on a substrate (not shown, usually formed of an insulating material), a buffer layer 10 is formed on the phosphor layer 5. The buffer layer 10 is a metal oxide thin film formed by general ALD without using plasma. Accordingly, no plasma damage appears in the interface between the phosphor layer 5 and the buffer layer 10. Next, a nitrogen-containing metal oxide thin film 20 having good breakdown properties is grown using PEALD. During the formation of the nitrogen-containing metal oxide thin film 20, the phosphor layer 5 can be protected from plasma damage due to the buffer layer 10 covering the same. The buffer layer 10 and the nitrogen-containing metal oxide thin film 20 may be grown in situ within the same reactor. Therefore, prior to the formation of the nitrogen-containing metal oxide layer according to the present invention using the method as described above, the substrate may be prepared to have a second metal oxide thin film by supplying in a cyclic fashion sequentially alternating pulses of a second metal source compound and oxygen gas into the reactor, followed by the formation of the nitrogen-containing metal oxide film 20 according to the present invention according to any pulsing scheme illustrated in FIGS. 1 through 4.

The buffer layer 10 may be the same kind or a different kind of metal oxide from the nitrogen-containing metal oxide layer 20 according to the present invention. Alternatively, the buffer layer 10 may be formed in combination with the metal oxide layer 20. For example, the buffer layer 10 may be a $TiO_2$ thin film grown using general ALD, whereas the nitrogen-containing method oxide thin film 20 may be a nitrogen-containing $Al_2O_3$ thin film grown using PEALD. Alternatively, the buffer layer 10 may be an $Al_2O_3$ thin film grown using general ALD, whereas the nitrogen-containing metal oxide thin film 20 may be a nitrogen-containing $Al_2O_3$ thin film grown using PEALD. In this case, for both the buffer layer 10 and the nitrogen-containing metal oxide thin film 20 commonly containing Al as a metal component, TMA may be used as a common metal source compound.

For an ELD having an insulating layer underneath a phosphor layer, the order of depositing layers is reversed with respect to the order described with reference to FIG. 5. In particular, after the nitrogen-containing metal oxide thin film 20 is formed, the buffer layer 10 is grown thereon using general ALD, and then the phosphor layer 5 is formed on the buffer layer 10. As a result, the density of interface electron traps between the phosphor layer 5 and the buffer layer 10 can be maintained to be high.

Alternatively, the buffer layer 10 and the nitrogen-containing metal oxide thin film 20 may be formed alternately several times using general ALD and PEALD according to the present invention, respectively, to have a multi-layered structure on the phosphor layer 5, as shown in FIG. 6. The buffer layer 10 and the nitrogen-containing metal oxide thin film 20 may be formed of the same kind of metal oxide or different kinds of metal oxides.

The insulating layer having such a stacked structure as described with reference to FIGS. 5 and 6 is advantageous for the gate dielectric layer of a semiconductor device as well as an insulating layer for an ELD. Since the gate dielectric layer requires good interfacial properties, it should be protected from plasma damage. Therefore, an oxide film is formed near a wafer using general ALD, and a nitrogen-containing metal oxide thin film is grown on the oxide film using PEALD according to the present invention to increase breakdown resistance. When the oxide film and the nitrogen-containing metal oxide film are formed using $Al_2O_3$, $ZrO_2$, or $HfO_2$, having a greater dielectric constant than conventional silicon oxides, the physical thickness of the oxide film can be increased for a small equivalent oxide thickness of about 20 Å, so that it is easy to control the thickness of the oxide film.

Figure 7:
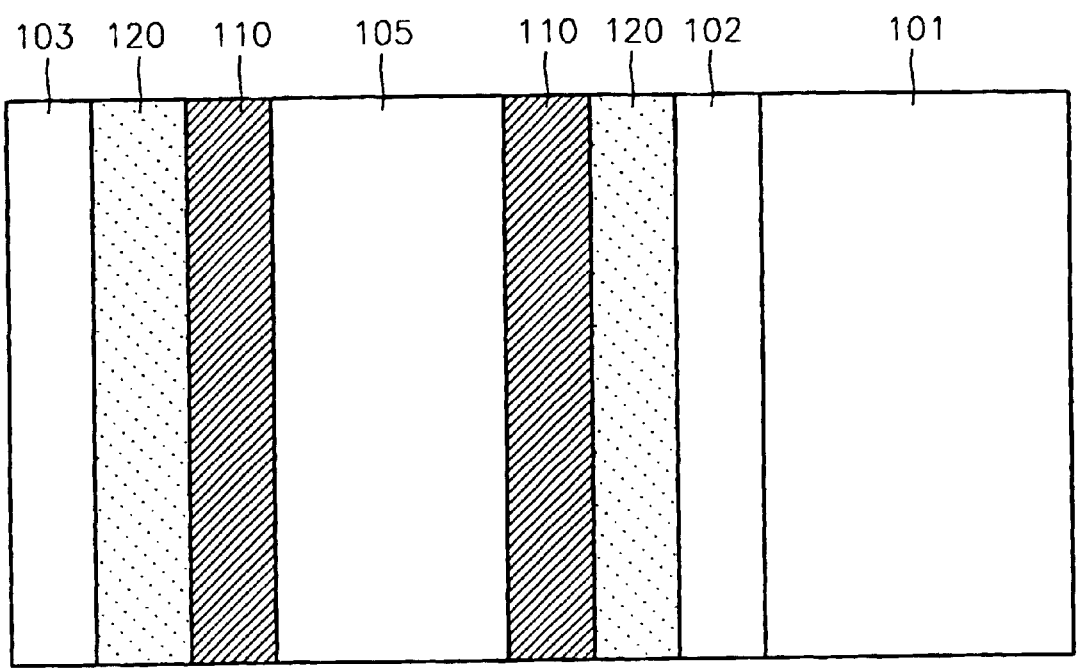
FIG. 7 is a sectional view of an electroluminescence display that can be manufactured using the thin film formation method according to the present invention.

FIG. 7 is a sectional view of an ELD device that can be manufactured based on the concept described above. Referring to FIG. 7, a lower electrode 102, a lower insulating layer 120, a buffer insulating layer 110, a phosphor layer 105, a buffer layer 110, an upper insulating layer 120, and an upper electrode 103 are sequentially stacked on a substrate 101. As described above, the lower and upper insulating layers 120 are nitrogen-containing metal oxide thin films formed using the method according to the present invention. When nitrogen gas is used as a nitrogen source gas, it is preferable that the upper and lower insulating layers 120 be formed as $Al_2O_3$ thin films containing nitrogen less than 1 atomic %.

The substrate 101 is preferably a glass substrate and has a thickness of about 1 mm. The lower electrode 102 is a transparent electrode formed of, for example, indium tin oxide (ITO), zinc oxide (ZnO), etc., to have a thickness of about 1000–2000 Å. The buffer insulating layer 110 is formed of an insulating material, such as $Al_2O_3$, $SiO_2$, $TiO_2$, etc., using general ALD, as described above. The phosphor layer 105 may be formed of a red-yellow phosphor, such as ZnS:Mn, or a blue-green phosphor, such as SrS:Ce or CaS:Pb. The upper electrode 103 is an opaque metal electrode formed by depositing Al to a thickness of about 1000–2000 Å. Therefore, luminescence can be observed through the transparent substrate 101. Alternatively, the substrate 101 may be a silicon substrate. In this case, the lower electrode 102 is an opaque metal electrode, and the upper electrode 103 is a transparent electrode, so that luminescence can be observed through the upper electrode 103.

An insulating layer contacting the phosphor layer in an ELD determines the quantity of electrons entering the phosphor layer under an electric field applied. The surface electron energy level in the interface between the insulating layer and the phosphor layer is a source to supply electrons into the phosphor layer. A higher surface electron energy level results in a higher probability of electrons entering the phosphor layer. The effective surface electron energy level is proportional to the is dielectric constant of the insulating layer. However, when a breakdown occurs in an insulating layer having a high dielectric constant by a high electric field applied to induce luminescence, the breakdown spreads, causing current leakage and dispersing the electric field. Meanwhile, although the nitrogen-containing metal oxide thin film according to the present invention has a high dielectric constant, a breakdown unlikely occurs, and no damage to the electric field occurs. This is considered because an electric path is blocked as the trace of nitrogen atoms added binds to an oxygen network of the oxide thin film.

Conventionally, a thick insulating layer is required to prevent a breakdown. However, it causes the problem of an increase in the threshold voltage of devices. However, although the nitrogen-containing metal oxide thin film according to the present invention is formed to be as thin as 150–160 nm for a 1 μm-thick phosphor layer, no breakdown occurs.

Experimental Example

In order to verify the improved breakdown characteristics of the nitrogen-containing metal oxide thin film according to the present invention, a nitrogen-containing $Al_2O_3$ thin film was grown using PEALD. For comparison, $Al_2O_3$ thin films containing no nitrogen were grown by ALD and PEALD, respectively. The results are shown in FIGS. 8 and 9.

The nitrogen-containing $Al_2O_3$ thin film according to the present invention was deposited under the following experimental conditions. TMA was used as a metal source compound. Argon gas was flowed at a rate of 200 sccm to carry TMA while maintaining the total flow rate to 600 sccm. The process was performed at an oxygen flow rate of 50 sccm, a nitrogen gas flow rate of 5–10 sccm, an RF source power of 300 W, a reactor pressure of 3 torr, and a temperature of 250–300° C. One cycle period was controlled to 6–7 seconds, and oxygen gas and nitrogen gas were simultaneously supplied according to the gas pulsing scheme illustrated in FIG. 1.

An $Al_2O_3$ thin film was grown according to the conventional ALD method under the same conditions as for the nitrogen-containing $Al_2O_3$ thin film according to the present invention, except that no plasma was generated and no nitrogen gas was supplied. In both cases, the $Al_2O_3$ thin films were formed to a thickness of about 50 nm.

Figure 8:
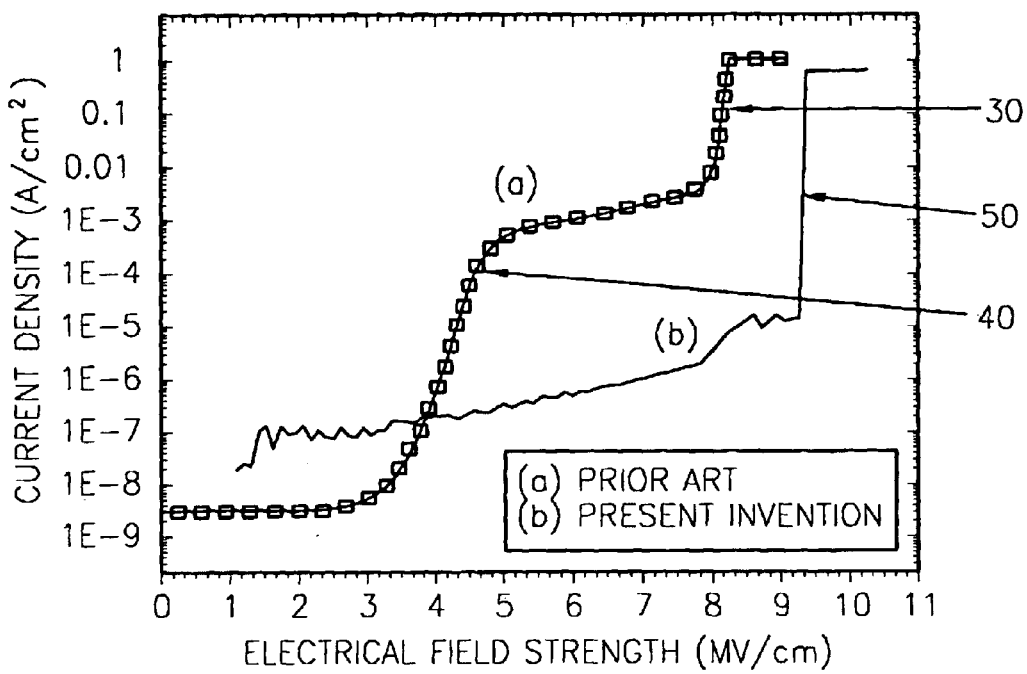
FIG. 8 is a graph comparatively showing the breakdown characteristics of a nitrogen-containing $Al_2O_3$ thin film formed according to the present invention and an $Al_2O_3$ thin film formed by a conventional ALD.
Figure 9:
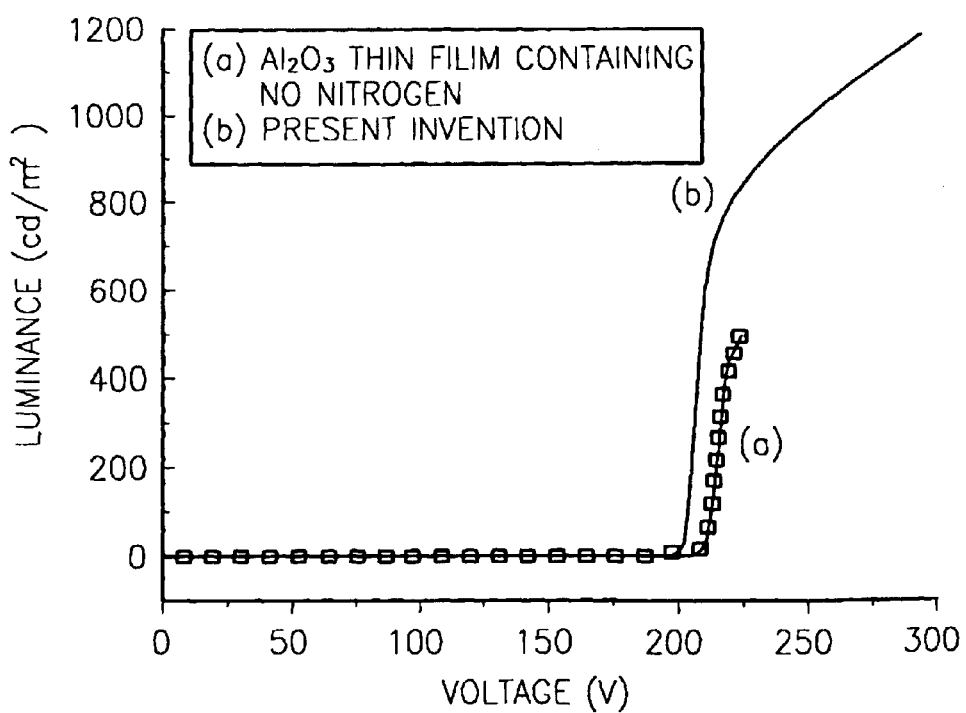
FIG. 9 is a graph comparatively showing the luminance of electroluminescence devices using $Al_2O_3$ thin films containing and not containing nitrogen, respectively.

FIG. 8 is a graph comparatively showing the breakdown characteristics of the $Al_2O_3$ thin films formed, respectively, using the ALD and PEALD methods. In FIG. 8, graph (a) is for the $Al_2O_3$ thin film formed using the general ALD method. In this case, prior to the occurrence of a breakdown 30 at an electrical field strength of 8 MV/cm, a soft breakdown 40 occurred at an electrical field strength of about 3 MV/cm. The conventional $Al_2O_3$ thin film was formed at 250° C. When the processing temperature is increased to 300° C., the breakdown voltage decreases to 7 MV/cm. Although it depends on the kind of precursor used and the processing conditions, a general $Al_2O_3$ thin film formed by ALD is known to undergo a breakdown at an electrical field strength of 5–6 MV/cm or less. In view of this, the $Al_2O_3$ thin film formed in the present experimental example using the ALD method for a comparison with the nitrogen-containing $Al_2O_3$ thin film according to the present invention is considered to have better quality than average.

In FIG. 8, graph (b) shows the breakdown characteristics of the nitrogen-containing $Al_2O_3$ thin film formed using the PEALD method according to the present invention. This nitrogen-containing $Al_2O_3$ thin film was formed at 300° C. Apparently, a breakdown occurred at an electrical field strength of about 9.5–10 MV/cm. In comparison with the $Al_2O_3$ thin film formed at 300° C. by general ALD, the breakdown voltage of the nitrogen-containing $Al_2O_3$ thin film according to the present invention is higher than that of the conventional $Al_2O_3$ thin film by about 2.5–3 MV/cm, which is an increase that is almost constant over the entire area. Accordingly, the nitrogen-containing $Al_2O_3$ thin film according to the present invention shows stable resistance to a breakdown at every position on the substrate. When plasma was generated from nitrogen gas in order to form a nitrogen-containing $Al_2O_3$ thin film, a very small amount of nitrogen, much less than 1 atomic %, was incorporated into the resulting nitrogen-containing $Al_2O_3$ thin film. Nevertheless, the electrical characteristics of the nitrogen-containing $Al_2O_3$ thin film were considerably improved. Since nitrogen gas is so stable that it hardly decomposes at 300–400 W, and only 1 atomic % of nitrogen is incorporated into the nitrogen-containing $Al_2O_3$ thin film. However, when ammonia or nitrogen dioxide gas is used as a nitrogen source gas, a greater amount of nitrogen can be incorporated into the nitrogen-containing $Al_2O_3$ thin film according to the present invention for the same power level.

FIG. 9 is a graph comparatively showing the luminance of ELDs, one having an $Al_2O_3$ thin film containing no nitrogen and grown only using TMA and oxygen gas by PELAD, and the other having a nitrogen-containing $Al_2O_3$ thin film according to the present invention. In both the ELDs, ZnS:Mn was used for the phosphor layer. The phosphor layer was formed to be as thick as 1 μm, and the $Al_2O_3$ thin film containing or not containing nitrogen was formed to be as thin as 150–160 nm.

In FIG. 9, graph (a) is for the ELD having the $Al_2O_3$ thin film grown using PEALD not to contain nitrogen for a comparison with the present invention. This ELD was stable at a voltage 20 V higher than the threshold voltage. Graph (b) is for the ELD having the nitrogen-containing $Al_2O_3$ thin film grown using PEALD according to the present invention. This ELD was stable at a voltage 100 V higher than the threshold voltage. The nitrogen-containing $Al_2O_3$ thin film according to the present invention provides more improvements, when applied to a device, than just improving the breakdown voltage of the film as shown in FIG. 8. The nitrogen-containing $Al_2O_3$ thin film increased the luminance of the ELD. Accordingly, when the nitrogen-containing metal oxide thin film formed using the PEALD method according to the present invention is used as an insulating layer for an ELD, the thickness of the insulating layer can be reduced, thereby further reducing the threshold voltage. In contrast, when the metal oxide film containing no nitrogen is formed on a relatively thick phosphor layer using general ALD or PEALD, it is required to increase the thickness of the metal oxide film to be greater than that of the nitrogen-containing metal oxide thin film according to the present invention, in order to ensure stable operation of the device. As a result, undesirably the threshold voltage increases. As is evident from the above example, the nitrogen-containing oxide thin film according to the present invention has improved electrical characteristics, particularly, in breakdown resistance, and can be applied to devices with improved operational stability.

A feature of the present invention lies in the improvement of the characteristics of films through the addition of nitrogen into an oxide thin film. However, the various methods of adding nitrogen in situ, as taught above, to implement the present invention are more significant in the present invention than the fact of adding nitrogen itself.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming a nitrogen-containing metal oxide thin film on a substrate by supplying a source metal compound and oxygen gas into a reactor in a cyclic fashion with sequential alternating pulses of the source metal compound and the oxygen gas, wherein the oxygen gas is activated into plasma over the substrate in synchronization with the pulsing thereof, and a nitrogen source gas is further sequentially pulsed into the reactor and activated into plasma over the substrate in synchronization with the pulsing thereof.

2. The method of claim 1, wherein the oxygen gas and the nitrogen source gas are supplied at the same pulsing cycle.

3. The method of claim 1, wherein the nitrogen source gas is supplied after the oxygen gas.

4. The method of claim 1, wherein the oxygen gas is supplied after the nitrogen source gas.

5. The method of claim 1, wherein the nitrogen source gas is one selected from the group consisting of $N_2$, $NH_3$, $NO_2$, $N_2O$, and a mixture of the forgoing gases.

6. The method of claim 1, wherein at least one of the metal source compound, the oxygen gas, and the nitrogen source gas is supplied while being diluted with an inert carrier gas.

7. The method of claim 1, wherein the metal oxide is one selected from the group consisting of $Al_2O_3$, $Ta_2O_5$, $TiO_2$, $ZrO_2$, $HfO_2$, and lanthanide series oxide.

8. The method of claim 1, wherein nitrogen atoms are incorporated into the metal oxide thin film as the nitrogen source gas is supplied.

9. The method of claim 1, wherein the substrate is prepared to have a second metal oxide thin film by supplying a second metal source compound and oxygen gas into the reactor in a cyclic fashion with sequential alternating pulses of the second metal source compound and the oxygen gas.

10. The method of claim 9, wherein the second metal source compound and the metal source compound are the same.

11. The method of claim 10, wherein the second metal source compound and the metal source compound are trimethylalumminum.

12. The method of claim 1, wherein after the metal oxide thin film has been formed, a second metal oxide thin film is additionally formed by supplying a second metal source compound and oxygen gas into the reactor in a cyclic fashion with sequential alternating pulses of the second metal source compound and the oxygen gas.

13. The method of claim 12, wherein the second metal source compound and the metal source compound are the same.

14. The method of claim 13, wherein the second metal source compound and the metal source compound are trimethylalumminum.

15. A method for forming a nitrogen-containing metal oxide thin film on a substrate by supplying a source metal compound and a reactant gas into a reactor in a cyclic fashion with sequential alternating pulses of the source metal compound and the reactant gas, wherein the reactant gas is activated into plasma over the substrate in synchronization with the pulsing thereof, and the reactant gas contains both nitrogen and oxygen atoms.

16. The method of claim 15, wherein the nitrogen source gas is one selected from the group consisting of $NO_2$, $N_2O$, and a mixture of the forgoing gases.

17. The method of claim 15, wherein the substrate is prepared to have a second metal oxide thin film by supplying a second metal source compound and oxygen gas into the reactor in a cyclic fashion with sequential alternating pulses of the second metal source compound and the oxygen gas.

18. The method of claim 17, wherein the second metal source compound and the metal source compound are the same.

19. The method of claim 15, wherein after the metal oxide thin film has been formed, a second metal oxide thin film is additionally formed by supplying a second metal source compound and oxygen gas into the reactor in a cyclic fashion with sequential alternating pulses of the second metal source compound and the oxygen gas.

20. The method of claim 15, wherein the metal oxide is one selected from the group consisting of $Al_2O_3$, $Ta_2O_5$, $TiO_2$, $ZrO_2$, $HfO_2$, and lanthanide series oxide.

* * * * *